(12) United States Patent
Thiede et al.

(10) Patent No.: US 8,410,790 B2
(45) Date of Patent: *Apr. 2, 2013

(54) APPARATUS FOR TESTING TRANSFORMERS

(75) Inventors: Andreas Thiede, Schoenborn (DE); Yulong Huang, Dresden (DE); Uwe Stephan, Freital (DE)

(73) Assignee: Maschinenfabrik Reinhausen GmbH, Regensburg (DE)

( * ) Notice: Subject to any disclaimer, the term of this patent is extended or adjusted under 35 U.S.C. 154(b) by 311 days.

This patent is subject to a terminal disclaimer.

(21) Appl. No.: 12/738,887

(22) PCT Filed: Dec. 3, 2008

(86) PCT No.: PCT/EP2008/010207
§ 371 (c)(1),
(2), (4) Date: Apr. 29, 2010

(87) PCT Pub. No.: WO2009/071266
PCT Pub. Date: Jun. 11, 2009

(65) Prior Publication Data
US 2010/0259280 A1    Oct. 14, 2010

(30) Foreign Application Priority Data
Dec. 8, 2007  (DE) .......................... 10 2007 059 289

(51) Int. Cl.
*G01R 31/06* (2006.01)
(52) U.S. Cl. ........................................ 324/547
(58) Field of Classification Search .................. None
See application file for complete search history.

(56) References Cited

U.S. PATENT DOCUMENTS

| | | | |
|---|---|---|---|
| 3,555,291 A | 1/1971 | Dewey | |
| 3,963,975 A | 6/1976 | Gauper | |
| 4,338,561 A * | 7/1982 | Zaengl et al. | 324/551 |
| 5,949,662 A | 9/1999 | Boldin | |
| 2003/0107904 A1 | 6/2003 | Guggisberg | |
| 2011/0121853 A1* | 5/2011 | Werle et al. | 324/757.01 |
| 2011/0148433 A1* | 6/2011 | Blank et al. | 324/555 |
| 2012/0139556 A1* | 6/2012 | Annowsky et al. | 324/547 |

FOREIGN PATENT DOCUMENTS

| | | |
|---|---|---|
| CH | 688703 A5 * | 1/1998 |
| DE | 4232356 B | 3/1994 |
| EP | 0268046 A | 5/1988 |
| EP | 1017147 A | 7/2000 |

OTHER PUBLICATIONS

Winter et al: "A mobile transformer test system based on a stativ frequencey converter" XV International Symposium on high voltage engineering, University of Ljubljana, Elektroinstitut Milan Vidmar, Sloventia, Aug. 2007, retrieved from the Internet: http://ww/ish2007.org/pdf/aWinter.pdf, p. 3, right hand column, paragraph 3; p. 4, right hand columns, paragraph 3; figure 4.

Kiel et al: High Performance Digital Control of Uninterruptible Power Supply (UPS) Using an Application Specific Inegrated circuit (ASIC), 4th European Conference on Power Electronics and Applications, Florence, Italy, Sep. 1991.

* cited by examiner

*Primary Examiner* — Jermele M Hollington
(74) *Attorney, Agent, or Firm* — Andrew Wilford

(57) ABSTRACT

The invention relates to a device for testing transformers, having a static frequency converter (2). The static frequency converter (2) comprises a plurality of outlets (21, 22, 23), which are connected to a filter device (6). The filter device (6) also comprises a plurality of outlets (31, 32, 33), which are connected to a matching transformer (8), and wherein the matching transformer (8) is connected to the transformer (15) intended for testing. The filter device (6) is a filter transformer (11).

3 Claims, 4 Drawing Sheets

*Fig. 1 - Prior Art*

APPARATUS FOR TESTING TRANSFORMERS

CROSS REFERENCE TO RELATED APPLICATIONS

This application is the US national phase of PCT application PCT/EP2008/010207, filed 3 Dec. 2008, published 11 Jun. 2009 as WO2009/071266, and claiming the priority of German patent application 102007059289.4 itself filed 8 Dec. 2007, whose entire disclosures are herewith incorporated by reference.

FIELD OF THE INVENTION

This invention relates to an apparatus for testing transformers.

BACKGROUND OF THE INVENTION

Such a transformer-testing apparatus typically has a static frequency converter that includes multiple outputs connected to a filter. The filter also has multiple outputs that are connected to a matching transformer connected to the transformer being tested.

An article titled "High-Performance Digital Control of Uninterruptible Power Supply (UPS) Using an Applications-Specific Integrated Circuit (ASIC) was published in the conference proceedings of the "European Conference on Power Electronics and Applications." The conference took place 3-6 Sep. 1991 in Florence. The conference proceedings were also published in 1991. For the purpose of complete digital control of a UPS system, an appropriate ASIC was designed that provides fast current control and voltage control. Use of this ASIC with the UPS system enables excellent dynamic response to be achieved (rapid step response, low harmonic distortion with nonlinear loads). The digital circuit comprises seven PI controllers, a sine-wave generator, an interface to the analog-to-digital converters, and PWM generation for the switching signals. An uninterruptible power supply (UPS) is required for all applications where an electrical system must operate even in the event of a power failure.

German patent publication DE 19 239 85 [U.S. Pat. No. 3,555,291] describes a filter for a power-transmission system. In AC systems, it is often necessary to filter out unwanted harmonic oscillations. This multiphase electrical power transmission system is composed of multiple conductors that have a certain inductance. An alternating current is applied to the conductors, which current has both typical and atypical harmonic components. In addition, multiple filters for typical harmonic components are connected to the conductors. In addition, another filter is provided with an impedance that is coupled to the conductors and functions to attenuate the atypical harmonic components of the system voltage. This typical harmonic component is created by the interaction between the atypical harmonic component of the current at high impedance that results when the inductance and the impedance of the harmonic filter are in resonance. However, this document does not mention anything about the testing of transformers.

Published German patent DE 42 323 56 discloses a power supply unit comprising at least two current sources. Each current source is fed by at least one respective power converter into an AC system. In order to reduce the amplitude of a given harmonic component that is present, the voltage of at least one power converter is fed into the system with a trigger delay angle when phase-shifted relative to at least one other power converter.

Published German patent DE 19 546 420 [U.S. Pat. No. 5,949,662] also discloses an uninterruptible power supply. The uninterruptible power supply comprises a line-side commutation reactor, a voltage source inverter with associated controller, an output filter composed of a transformer of large leakage inductance and filter capacitors to the static bypass switch with associated controller, and a manual bypass switch. A frequency converter from the field of drive engineering is used as the converter. An input filter is connected on the input side of this frequency converter, a battery connection device being provided at the DC terminals. As a result, it is possible to construct an uninterruptible power supply using commercially available components from the field of drive engineering and with UPS-specific components, which supply utilizes the technical and economic synergies of drive engineering. The document also does not deal with the testing of transformers.

EP 0 268 046 describes a method of and a circuit for regulating and controlling three-phase inverters with sequence regulation. The focus of this application is on describing a system subject to an asymmetric load. The use of a transformer between the inverter and filter unit is listed as an example of an application. The transformer functions only to convert voltage.

DE 26 08 541 [U.S. Pat. No. 3,963,975] describes an electromagnetically shielded power supply in which an electrical cancelling signal is obtained on the secondary side of the transformer in addition to the electrostatic screen for attenuating asymmetrical disturbance variables, the signal being fed in phase opposition into the useful-signal current circuit.

OBJECT OF THE INVENTION

The object of the invention is to create an apparatus for testing transformers that is improved in terms of attenuating asymmetrical disturbances.

SUMMARY OF THE INVENTION

This object is attained by an apparatus for testing transformers that is provided with a static frequency converter. The frequency converter includes multiple outputs that are connected to a filter, which itself has multiple outputs that are in turn connected to a matching transformer. The matching transformer itself is connected to the specific transformer provided for testing. The filter is a filter transformer.

An electrostatic screen is provided between the primary side and the secondary side of the filter transformer. Multiple filter capacitors are also provided on the secondary side of the filter transformer. The filter capacitors are configured here in a star connection.

It is particularly advantageous if the static frequency converter and the filter transformer are accommodated together with the filter capacitors in a switchgear cabinet. This has the benefit of suppressing the transfer of asymmetrical disturbances to the transformer that is undergoing testing.

BRIEF DESCRIPTION OF THE DRAWING

The purpose of the following discussion is to describe embodiments of the invention and their advantages in more detail based on the attached figures.

DETAILED DESCRIPTION

Figure 1:
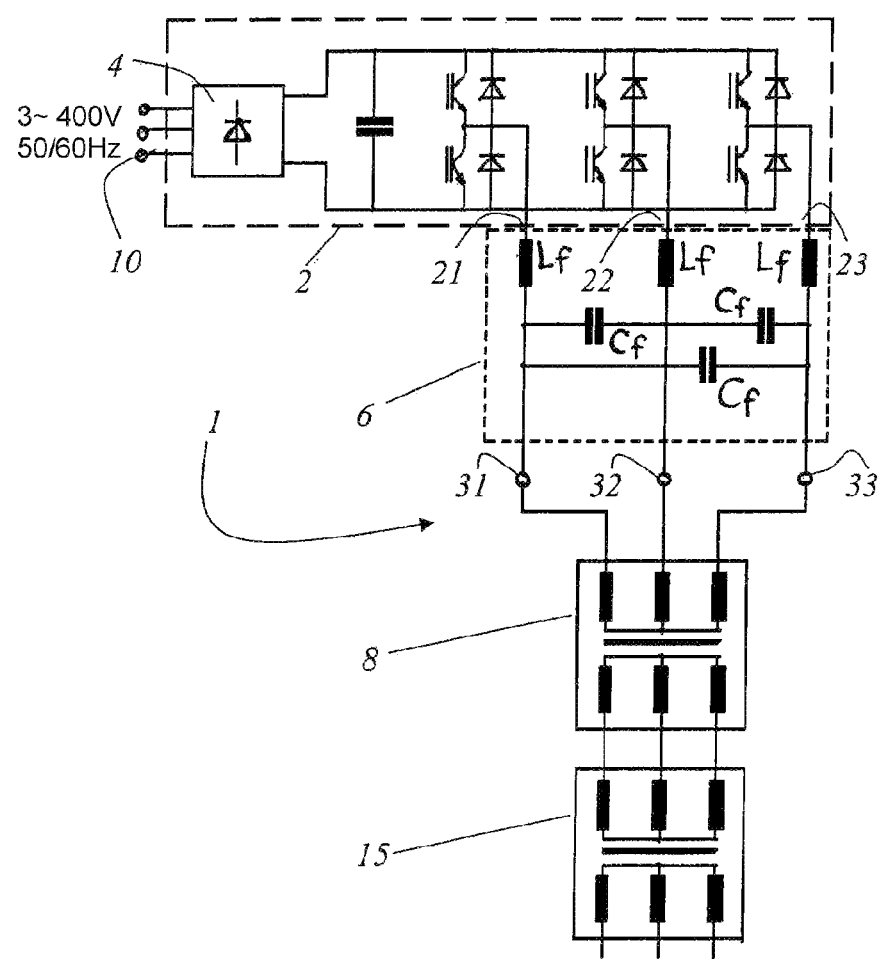
FIG. 1 shows a frequency converter that is employed in transformer testing. The frequency converter here is a static frequency converter with L-C sine filter.

FIG. 1 shows an apparatus of the prior art that is used to test power transformers from the field of power engineering. Previously, testing has been performed using rotary converters (motor-generators). These rotary converters have been replaced by a static frequency converter 2, as shown in FIG. 1. Static frequency converters 2 have clear advantages over rotary converters in terms of dynamics, wear, weight, and availability. An AC voltage 10 is supplied to the static frequency converter 2. The AC voltage 10 first passes to a rectifier. The frequency converter 2 has a first output 21, a second output 22, and a third output 23. The static frequency converter is a voltage source inverter with digital control operating with or without feedback.

The frequency converter 2 supplies the required variable output voltage, as well as the various required test frequencies. The test frequencies or test voltages here must meet specific requirements. The frequency converter 2 here must generate a sinusoidal, symmetrical AC voltage that has a distortion factor smaller than 5%. Induced voltage testing is effected to test the insulation systems of power transformers, during which testing partial-discharge measurements are performed. External disturbances affecting this measurement should not exceed a partial-discharge background level of $Q_s$=100 pC. This includes disturbances caused by the test voltage source itself.

The first output 21, second output 22, and third output 23 of the static frequency converter 2 are fed to a sine filter 6. The sine filter 6 acts as a low-pass filter, here an L-C filter. The sine filter 6 has a first output 31, a second output 32, and a third output 33. The first output 31, second output 32, and third output 33 of the sine filter 6 are connected to a matching transformer 8. The matching transformer 8 itself is in turn connected to a transformer 15 to be tested.

Figure 2:
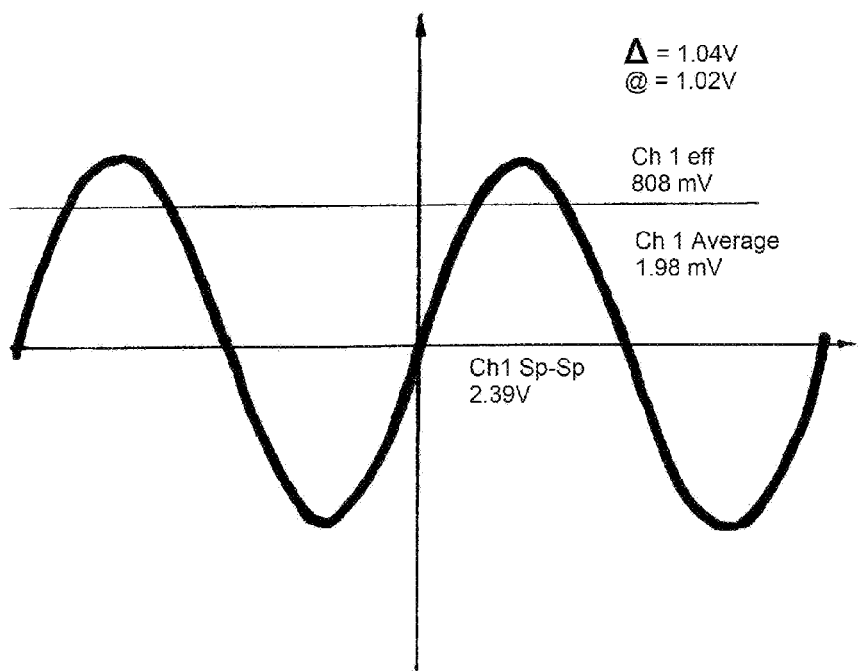
FIG. 2 is schematic diagram of the line-to-line voltage of the frequency converter connected downstream of the sine filter.

The disadvantage in the application of static frequency converters 2 is that due to their functional principle they generate a pulse-width-modulated, square-wave voltage with a large disturbance factor that in this form is initially not suited for testing power transformers. As shown in FIG. 1, an appropriate sine filter 6 is thus used. The result when this sine filter 6 is used is shown in FIG. 2. Use of the sine filter 6 enables sinusoidal line-to-line voltages to be generated having a disturbance factor of <5%.

Figure 3:
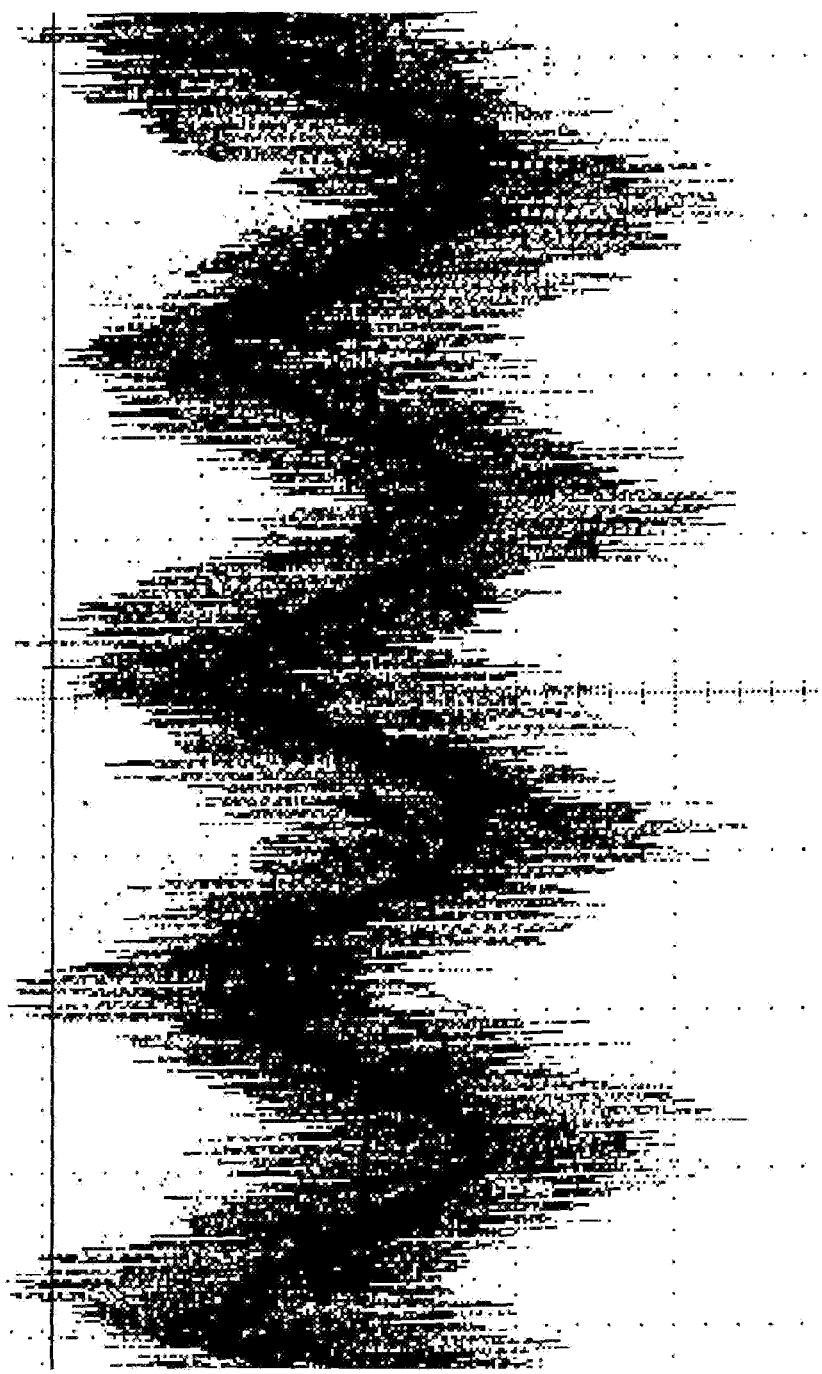
FIG. 3 is a diagram of the pulse-frequency jumps of the line-to-ground voltage at the inverter output.

Nevertheless, FIG. 3 illustrates disturbances that continue to occur despite the use of the sine filter 6. Despite the sine filter 6, pulse-frequency jumps cannot be suppressed in the line-to-ground voltage at the inverter output (asymmetrical disturbances). The asymmetrical disturbances are thus passed far from the static frequency converter 2 to the transformer 15 that is to be tested, and thus produce significant disturbances in the partial-discharge measurements. As a result, additional measures are required to nevertheless allow for partial-discharge measurements through these occurring asymmetrical disturbances.

Figure 4:
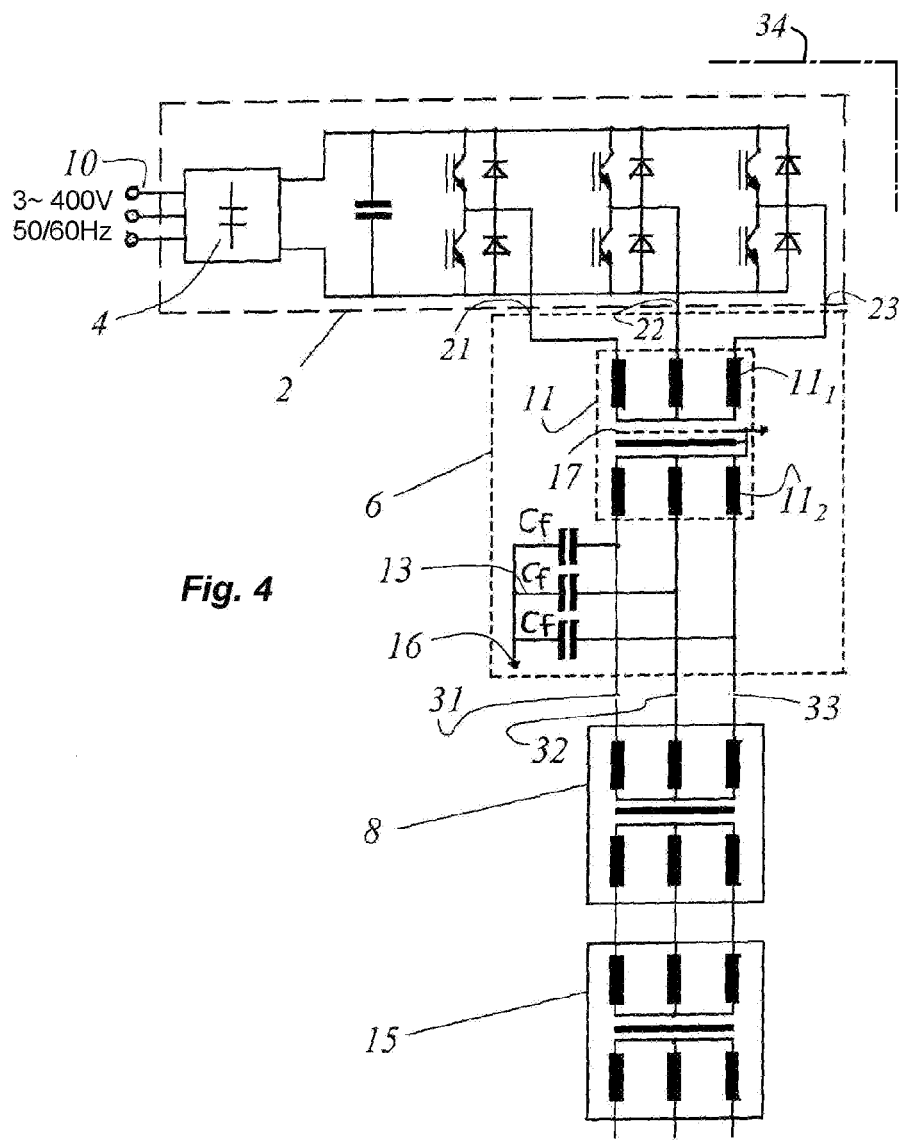
FIG. 4 shows an apparatus according to the invention in which a static frequency converter is used with a filter transformer.

The following description of FIG. 4 must be prefaced with the note that identical reference numerals are used for features that are identical to the features of FIG. 1. The purpose of the redesign of the filter 6 is both to enable the symmetrical output voltage of the frequency converter 2 to be filtered and also to enable asymmetrical disturbances to be suppressed. As a result, it should be possible to effect partial-discharge measurements on the transformer 15 to be tested.

According to the invention, the filter 6 has a filter transformer 11 in place of a sine filter. The filter transformer 11 is connected to the first output 21, second output 22, and third output 23 of the frequency converter 2. The filter transformer 11 has a primary side $11_1$ and a secondary side $11_2$. The filter transformer 11 provides the requisite inductance either through its own leakage inductance or through integrated series inductances. The secondary 112 of the filter transformer 11 is connected to filter capacitors that are configured in a star connection 13. The star point created by the star connection 13 is connected to ground 16. The filter transformer 11 provides the electrical isolation between the first output 21, second output 22, and third output 23 of the frequency converter 2 and the filter capacitors of star connection 13.

In addition, an electrostatic screen 17 is mounted between the primary $11_1$ and secondary $11_2$ of the filter transformer 11. The electrostatic screen 17 here additionally contributes to dissipating asymmetrical disturbances. This electrostatic screen 17 is of course also grounded.

The filter 6, which is composed of the filter transformer 11 and the star connection 13 of filter capacitors, is connected by the first output 31, second output 32, and third output 33 to the matching transformer 8. As was already described in FIG. 1, the matching transformer is connected to the transformer 15 that is to undergo testing. It is particularly advantageous if the filter transformer 11 is disposed in the converter cabinet such as shown schematically at 34 in FIG. 4 together with the star connection 13 of filter capacitors. Due to this spatial configuration, the transfer of asymmetrical disturbances is prevented from passing to transformer 15 to be tested. As a result, it is possible to perform partial-discharge measurements since the asymmetrical disturbances have been filtered out.

It is advantageous in particular to use the filter transformer 11 for high-voltage testing engineering. In the specific case, the filter transformer 11 is used to test power transformers for the purpose of suppressing partial-discharge interference emission (asymmetrical disturbances) from the static frequency converters 2. As already mentioned, providing the filter transformer 11 in the converter cabinet 34 produces the result that asymmetrical disturbances are not transferred to the test system to interfere with partial-discharge measurement.

The invention has been described with reference to one embodiment. It is conceivable, however, that variations and modifications can be implemented without thereby departing from the scope of protection as set forth in the following claims.

The invention claimed is:

1. An apparatus for high-voltage testing a transformer, the apparatus comprising:
    a static frequency converter having a plurality of outputs;
    a filter transformer having a primary connected to the frequency-converter output and a secondary having a plurality of outputs;
    a grounded electrostatic screen between the primary and secondary;

respective capacitors each having one side connected to a respective one of the secondary outputs and an opposite side connected star-fashion to a common ground; and a matching transformer connected to the filter outputs and connectable to the transformer to be tested.

2. The apparatus according to claim 1, wherein the static frequency converter and the filter transformer are held together with the filter capacitors inside a switchgear cabinet such that no asymmetrical disturbances can pass to the transformer to be tested.

3. The test apparatus defined in claim 1, wherein the static frequency converter comprises:

a rectifier circuit having an input connectable to an alternating-current source and a plurality of outputs producing square-wave voltage and connectable to the primary of the filter transformer.

* * * * *